United States Patent [19]

Tokushima

[11] Patent Number: 5,618,753
[45] Date of Patent: Apr. 8, 1997

[54] METHOD FOR FORMING ELECTRODES ON MESA STRUCTURES OF A SEMICONDUCTOR SUBSTRATE

[75] Inventor: Masatoshi Tokushima, Tokyo, Japan

[73] Assignee: NEC Corporation, Tokyo, Japan

[21] Appl. No.: 539,065

[22] Filed: Oct. 4, 1995

[30] Foreign Application Priority Data

Oct. 4, 1994 [JP] Japan .................................. 6-239927
Mar. 30, 1995 [JP] Japan .................................. 7-073099

[51] Int. Cl.$^6$ ............................................. H01L 21/28
[52] U.S. Cl. ......................... 438/666; 438/702; 438/666; 438/742; 438/975
[58] Field of Search ............................ 437/133, 180, 437/184, 228, 924, 947, 981, 984; 156/662.1; 148/DIG. 102; 257/623, 797

[56] References Cited

U.S. PATENT DOCUMENTS

| 3,728,236 | 4/1973 | Weller et al. .................... 437/228 |
| 3,764,865 | 10/1973 | Napoli et al. .................... 437/184 |
| 4,295,267 | 10/1981 | Harrington et al. .............. 437/947 |
| 4,879,254 | 11/1989 | Tsuzuki et al. .................. 437/984 |
| 5,015,603 | 5/1991 | Boos et al. ...................... 437/184 |
| 5,168,071 | 12/1992 | Fullowan et al. ................ 437/184 |
| 5,185,293 | 2/1993 | Franke et al. ................... 437/184 |
| 5,270,245 | 12/1993 | Gaw et al. ....................... 437/984 |
| 5,308,682 | 5/1994 | Morikawa ........................ 287/797 |
| 5,468,664 | 11/1995 | Kajita ............................. 437/924 |
| 5,521,110 | 5/1996 | Gill ................................. 437/984 |

FOREIGN PATENT DOCUMENTS

| 56-007434 | 1/1981 | Japan . |
| 58-138077 | 8/1983 | Japan . |
| 63-161646 | 7/1988 | Japan . |
| 02086137 | 3/1990 | Japan . |

Primary Examiner—John Niebling
Assistant Examiner—Thomas G. Bilodeau
Attorney, Agent, or Firm—Young & Thompson

[57] ABSTRACT

A method for forming an electrode on a mesa structure of a semiconductor substrate. The method comprises the steps of: selectively forming an electrode on a predetermined area in a surface of the semiconductor substrate; and subjecting the substrate to a selective etching by use of the electrode as a mask to form a mesa structure on the substrate so that the mesa structure is self-aligned just under the electrode.

7 Claims, 5 Drawing Sheets

METHOD FOR FORMING ELECTRODES ON MESA STRUCTURES OF A SEMICONDUCTOR SUBSTRATE

BACKGROUND OF THE INVENTION

The present invention relates to a method for forming a semiconductor device, and more particularly to a method for forming electrodes on mesa structures of a semiconductor substrate.

A typical prior art reference will be described with reference to FIGS. 1A to 1D. As illustrated in FIG. 1A, a photoresist film 1 is selectively formed on a silicon substrate 2 so that the photoresist film is used as a mask for etching a selective part of the silicon substrate 2. As a result, on the silicon substrate 2, there is formed a rectangular-shaped convex portion which serves as a mask alignment mark 3 in a later process.

With reference to FIG. 1B, the photoresist film 1 is removed from a surface of the silicon substrate 2. A photoresist film 4 is formed on the surface of the silicon substrate 2 by an alignment with reference to the mask alignment mark 3. The photoresist film 4 is used as a mask to etch the silicon substrate 2, thereby an isolation mesa structure 5 is selectively formed on the surface of the silicon substrate.

With reference to FIG. 1C, the photoresist film 4 is removed from the surface of the silicon substrate 2. After this, a photoresist film 6 is formed on the surface of the silicon substrate 2 by an alignment with reference to the mask alignment mark 3. The photoresist film has openings over the mesa structure 5 of the silicon substrate 2. The photoresist film 6 is used as a mask for an evaporation of an electrically conductive material 7. As a result, the conductive material 7 is deposited not only on the photoresist film 6 but also on exposed surfaces of the silicon substrate 2.

With reference to FIG. 1D, the photoresist film 6 covered by the conductive material 7 is removed from the surface of the silicon substrate 2. As a result, the conductive material remains only on the exposed silicon surface which had not been covered by the photoresist film 6. The remaining conductive material is subjected to a lift-off treatment to form electrodes 8 on the mesa structure 5 of the silicon substrate 2.

The conventional method for forming the electrodes on the mesa structure of the silicon substrate is, however, engaged with a serious problem regarding significant deterioration of the accuracy of mask alignment when the photoresist films 4 and 6 are provided on the surface of the silicon substrate 2. In fact, the photoresist films 4 and 6 tend to be slightly displaced from a predetermined exact position on the silicon substrate. Such displacements of the photoresist films 4 and 6 result in a displacement of the electrodes from predetermined positions on the mesa structure 10 of the silicon substrate 2 as illustrated in FIG. 2. Such a semiconductor device is, in fact, unacceptable.

Another conventional method will be described with reference to FIG. 3A to 3C. With reference to FIG. 3A, a photoresist film 1 is selectively formed on a GaAs substrate 2 so that the photoresist film 1 is used as a mask for etching a selective part of the GaAs substrate 2. The etching is carried out by use of a phosphor-containing etchant. As a result, on the GaAs substrate 2, there is formed a rectangular-shaped convex portion which serves as a mask alignment mark 3 in a later process.

With reference to FIG. 3B, the photoresist film 1 is removed from a surface of the GaAs substrate 2. A photoresist film 4 is formed on the surface of the GaAs substrate 2 by an alignment with reference to the mask alignment mark 3. The photoresist film 4 is used as a mask to etch the GaAs substrate 2 by use of a phosphor-containing etchant, thereby an isolation mesa structure 5 is selectively formed on the surface of the GaAs substrate 2.

With reference to FIG. 3C, the photoresist film 4 is removed from the surface of the GaAs substrate 2. Thereafter, a photoresist film 6 is formed on the surface of the GaAs substrate 2 by an alignment with reference to the mask alignment mark 3. The photoresist film 6 has an opening over the mesa structure 5 of the GaAs substrate 2. The photoresist film 6 is used as a mask for an evaporation of an electrically conductive material 7. As a result, the conductive material 7 is deposited not only on the photoresist film 6 but also on exposed surfaces of the GaAs substrate 2.

With reference to FIG. 3D, the photoresist film 6 covered by the conductive material 7 is removed from the surface of the GaAs substrate 2, As a result, the conductive material 7 remains only on the exposed GaAs surface which had not been covered by the photoresist film 6. The remaining conductive material is subjected to a lift-off treatment to form electrodes 8 on the mesa structure 5 of the silicon substrate 2.

The conventional method for forming the electrodes on the mesa structure of the silicon substrate is also engaged with the same problem of significant deterioration of the accuracy of mask alignment when the photoresist films 4 and 6 are provided on the surface of the silicon substrate 2. In fact, the photoresist films 4 and 6 tend to be slightly displaced from a predetermined exact position on the silicon substrate. Such displacements of the photoresist films 4 and 6 result in a displacement of the electrode 9 from predetermined positions on the mesa structure 5 of the silicon substrate 5 as illustrated in FIG. 4. Such a semiconductor device is, in fact, unacceptable.

Under the above circumstances, it has been necessary to develop a quite novel method for forming electrodes on a mesa structure of a semiconductor substrate.

SUMMARY OF THE INVENTION

Accordingly, it is an object of the present invention to provide a novel method for forming electrodes on a mesa structure of a semiconductor substrate free from any problems and disadvantages as described above.

It is a further object of the present invention to provide a novel method for forming electrodes on a mesa structure of a semiconductor substrate which may improve the accuracy of mask alignment.

The above and other objects, features and advantages of the present invention will be apparent from the following descriptions.

According to the first present embodiment, prior to forming a mesa structure, an electrode is formed on a predetermined area in a surface of a semiconductor substrate. The electrode is then used as a mask for selectively etching the semiconductor substrate to form a mesa structure under the electrode. Namely, the mesa structure is formed by the self-alignment technique using the electrode as a mask. As a result, the electrode has peripheral edges just corresponding to edges of the mesa structure. This means that the electrode is formed just on the mesa structure without any displacement.

According to the second embodiment, a first photoresist film is formed on a semiconductor substrate so that the substrate is subjected to an etching which uses the photoresist film as a mask. As a result, a convex portion serving as a mask alignment mark is formed on a surface of the substrate. The first photoresist film is removed from the surface of the substrate. Then, a second photoresist film is formed with reference to the convex portion as the mask alignment mark. The second photoresist film is used as a mask when an electrically conductive material is deposited not only on the second photoresist film but also on an exposed substrate surface which is not covered by the second photoresist film. The second photoresist film covered by the electrically conductive material is removed by a lift-off method from the surface of the substrate, while the electrically conductive material deposited on the exposed substrate surface remains so as to serve as an electrode. The electrode is then used as a mask for etching the substrate, thereby a mesa structure is formed by a self-alignment technique under the electrode.

According to the third embodiment, a first photoresist film is formed on a semiconductor substrate. The first photoresist film is then use as a mask for etching the substrate, thereby a convex portion serving as a mask alignment mark is formed on a surface of the substrate. The first photoresist film is removed from the surface of the substrate. An electrically conductive material is then deposited on an entire surface of the substrate. Thereafter, a second photoresist film is formed on a predetermined area of the electrically conductive material. The second photoresist film is used as a mask for etching the electrically conductive material to form an electrode. The electrode is then used as a mask for etching the substrate to form a mesa structure under the electrode by use of the self-alignment technique.

According to the fourth embodiment, after the formation of the mesa structure, a third photoresist film may be provided with reference to the convex portion as a mask alignment mark so that a part of the electrode is further etched by use of the third photoresist film as a mask. Then, the third photoresist film is removed from the surface of the substrate.

According to the fifth embodiment, both an electrode and a mask for forming a mask alignment mark are simultaneously and selectively formed on a surface of a semiconductor substrate. Both the electrode and the mask are used as masks for etching the substrate, thereby both a convex portion serving as a mask alignment mark and a mesa structure are simultaneously formed under the mask and the electrode respectively.

According to the sixth embodiment, an electrically conductive material is deposited on an entire surface of a semiconductor substrate. A single photoresist film is provided on the electrically conductive material. The electrically conductive material is etched by use of the single photoresist film as a mask, thereby both a mesa structure and a convex portion serving as a mask alignment mark are simultaneously formed.

According to the above first to sixth embodiments, the accuracy of alignment of the electrode on the mesa structure is surely improved. This causes the yield of the semiconductor device to be improved. This also ensures a high reliability of the semiconductor device. The electrode may be various type electrodes such as an ohmic contact.

BRIEF DESCRIPTIONS OF THE DRAWINGS

Preferred embodiments of the present invention will be described in detail with reference to the accompanying drawings.

DESCRIPTION OF THE PREFERRED EMBODIMENTS

A first embodiment according to the present invention will be described with reference to FIGS. 5A to 5F, wherein a novel method for forming an electrode on a mesa structure of a substrate is provided.

Figure 1A:
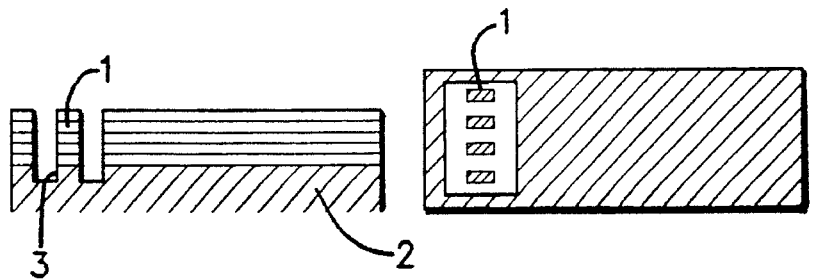
FIGS. 1A to 1D are fragmentary cross sectional elevation views illustrative of semiconductor devices in sequential fabrication steps involved in the conventional method for forming the electrode on the mesa structure of the semiconductor substrate.
Figure 1B:
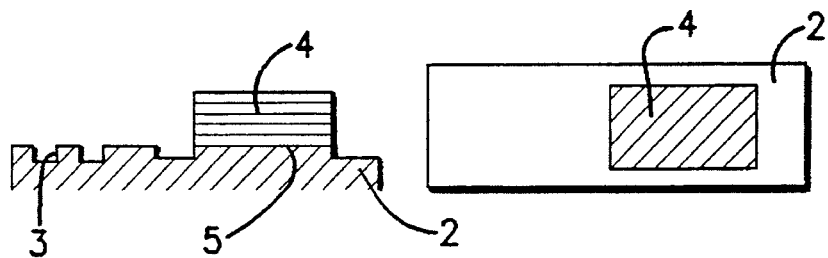
Figure 1C:
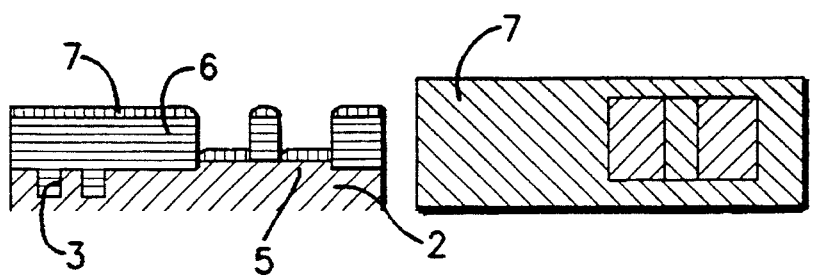
Figure 1D:
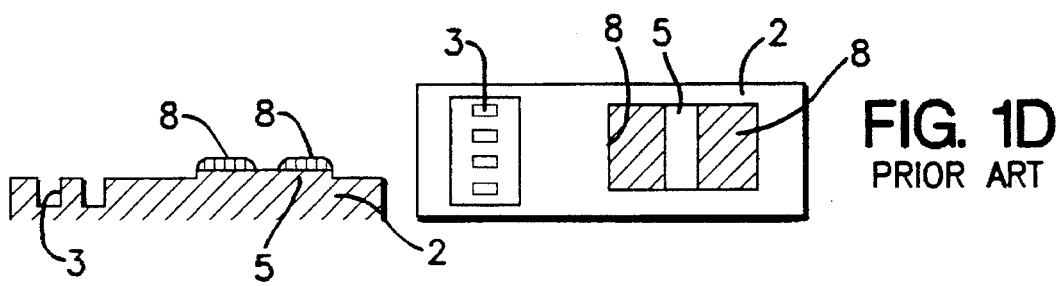
Figure 2:
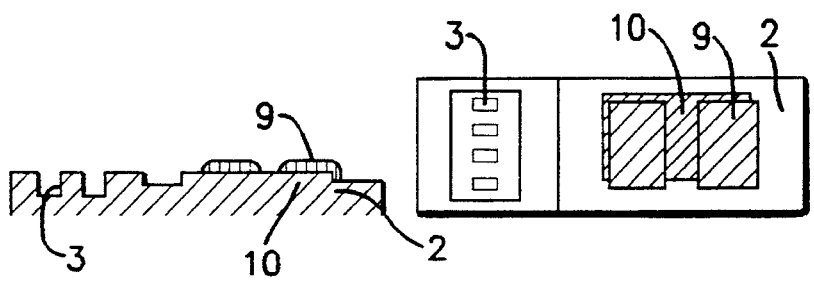
FIG. 2 is a fragmentary cross sectional elevation view illustrative of a semiconductor device to explain the problem caused by the conventional method.
Figure 3A:
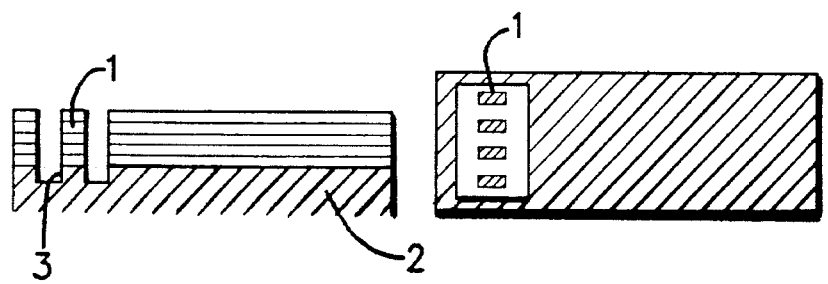
FIGS. 3A to 3D are fragmentary cross sectional elevation views illustrative of semiconductor devices in sequential fabrication steps involved in the other conventional method for forming the electrode on the mesa structure of the semiconductor substrate.
Figure 3B:
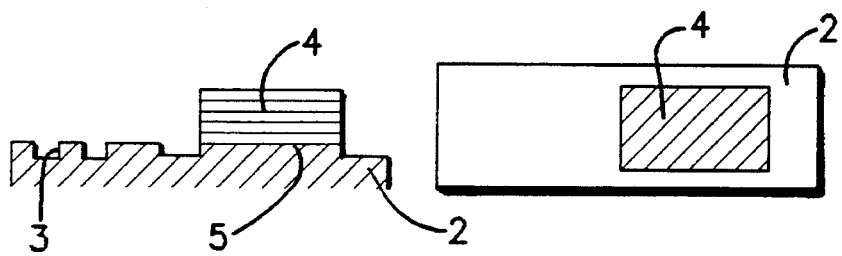
Figure 3C:
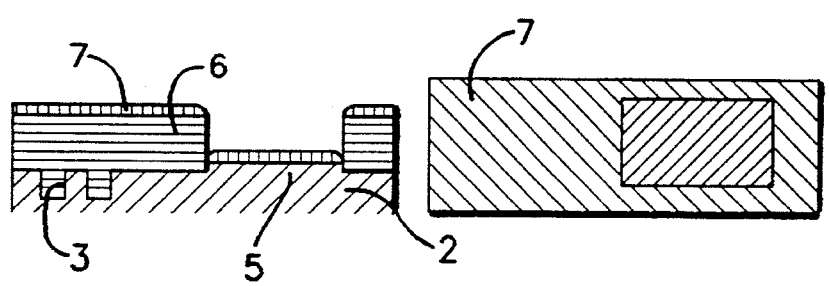
Figure 3D:
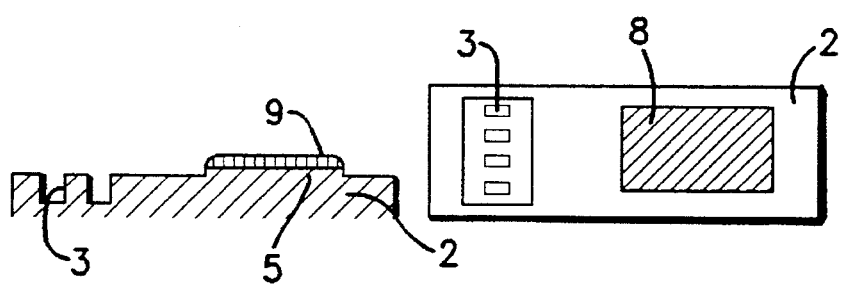
Figure 4:
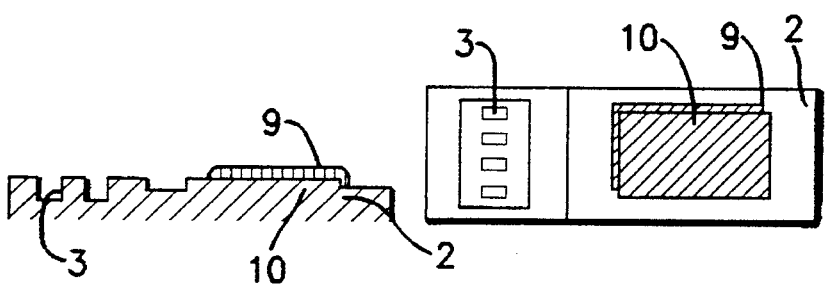
FIG. 4 is a fragmentary cross sectional elevation view illustrative of a semiconductor device to explain the problem caused by the other conventional method.
Figure 5A:
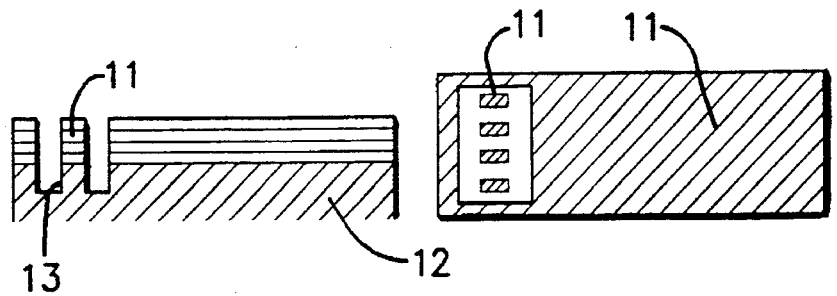
FIGS. 5A to 5F are fragmentary cross sectional elevation views illustrative of semiconductor devices in sequential fabrication steps involved in a novel method for forming the electrode on the mesa structure of the semiconductor substrate in a first embodiment according to the present invention.

With reference to FIG. 5A, a photoresist pattern 11 is formed on a substrate 12. The photoresist pattern 11 is used as a mask for etching the substrate 12, thereby a mask alignment mark 13 comprising a convex portion is formed.

Figure 5B:
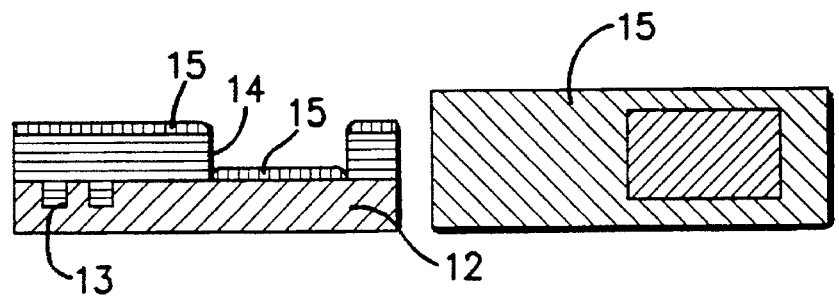

With reference to FIG. 5B, the photoresist pattern 11 is removed from the surface of the substrate 12. A photoresist pattern 14 is provided on the surface of the substrate 12 with reference to the mask alignment mark 13. The photoresist pattern 14 is then used as a mask for evaporation of an electrode material 15 not only on the photoresist pattern 14 but also on an exposed substrate surface not covered by, the photoresist pattern 14.

Figure 5C:
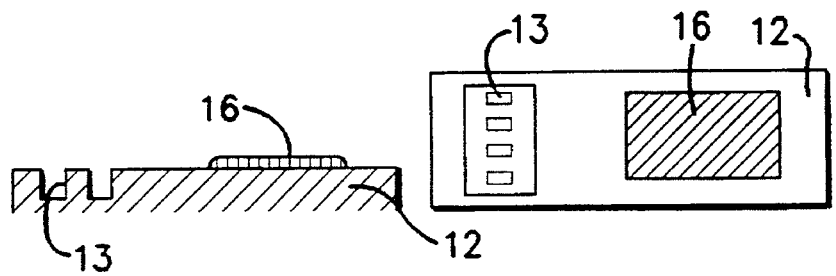

With reference to FIG. 5C, the photoresist pattern 14 covered by the electrode material 15 is removed by a lift-off method from the surface of the substrate 12. As a result, the electrode material 15 remains only on the exposed substrate surface so that the remaining part of the electrode material 15 serves as an electrode 16.

Figure 5D:
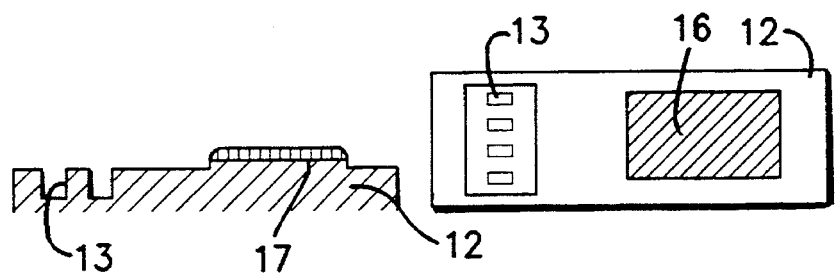

With reference to FIG. 5D, the electrode 16 is then used as a mask for etching the substrate 12, thereby a mesa structure 17 is formed under the electrode 16 by use of a self-alignment technique.

Figure 5E:
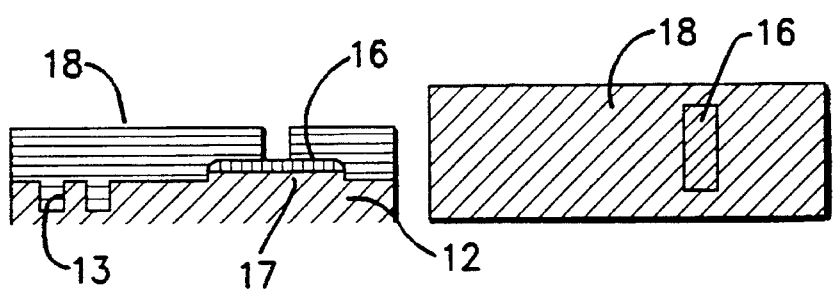

With reference to FIG. 5E, a photoresist pattern 18 is provided on the surface of the substrate 12 with reference to the mask alignment mark 13. The photoresist pattern 18 is then used as a mask for etching a part of the electrode 16. As a result, two divided electrodes 16 are formed on the mesa structure 17, wherein edges of the electrodes 16 exactly correspond to edges of the mesa structure 17.

Figure 5F:
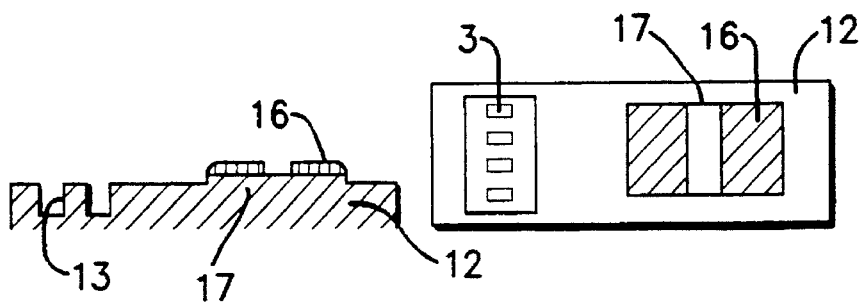

With reference to FIG. 5F, the photoresist pattern 18 is removed form the surface of the substrate 12, thereby the semiconductor device with the mesa structure provided with the electrodes thereon is formed.

The above described novel method utilizes the self-alignment technique for forming the mesa structure under the electrode. For that reason, the electrodes are free of any displacement from a predetermined region on the top of the mesa structure.

The electrodes may optionally be either an alloy ohmic electrode, a non- alloy ohmic electrode or a Schottky electrode.

As to the method for forming the electrode, it is also available, in place of the above described lift-off method, that a deposition of the electrode material on the entire surface of the substrate is followed by etching the deposited electrode material with use of a photoresist pattern as a mask.

Whereas both wet or dry etching methods are applicable to etching the substrate and the electrode, an anisotropic etching method is more preferable in order to further improve the accuracy of alignment of the electrode to the mesa structure.

According to the above novel method, the accuracy of alignment of the electrode on the mesa structure is surely improved. This causes an improvement m the yield of the semiconductor device. This also ensures a high reliability of the semiconductor device.

A second embodiment according to the present invention will be described with reference to FIGS. 6A to 6C, wherein a novel method for forming an electrode on a mesa structure of a substrate is provided.

Figure 6A:
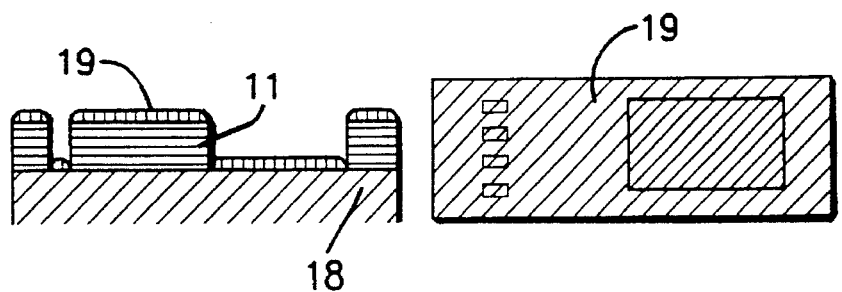
FIGS. 6A to 6C are fragmentary cross sectional elevation views illustrative of semiconductor devices in sequential fabrication steps involved in a novel method for forming the electrode on the mesa structure of the semiconductor substrate in a second embodiment according to the present invention.

With reference to FIG. 6A, a photoresist pattern 11 is provided on a GaAs substrate 18. The photoresist pattern 11 is then used as a mask for a deposition of a Pt electrode material 19 not only on the photoresist pattern 11 but also on an exposed substrate surface.

Figure 6B:
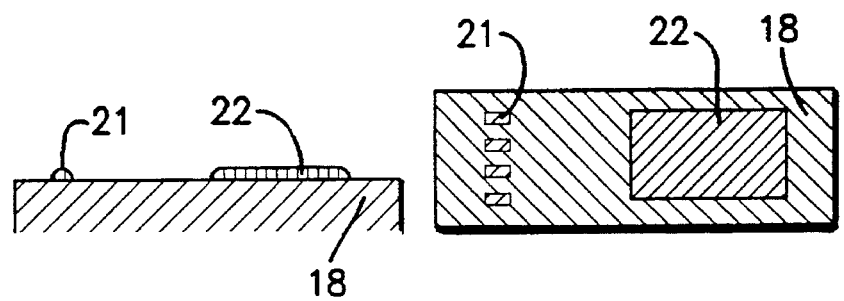

With reference to FIG. 6B, the photoresist pattern 11 covered by the Pt electrode material 19 is removed by a lift-off method from the surface of the substrate 18. As a result, the Pt electrode material 19 remains only on the exposed substrate surface, thereby a Pt mask 21 and a Pt electrode 22 are simultaneously formed.

Figure 6C:
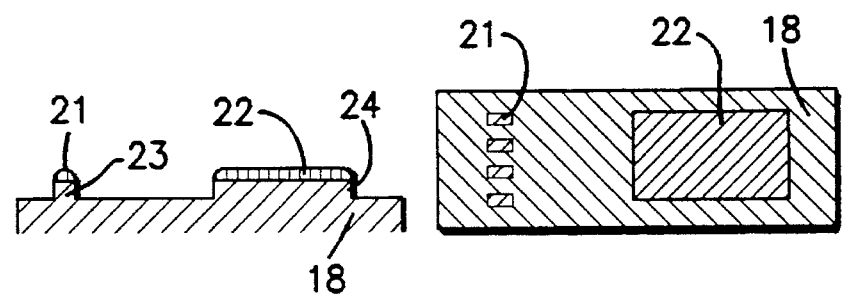

With reference to FIG. 6C, both the Pt mask 21 and the Pt electrode 22 are used as masks for etching the GaAs substrate 18. As a result, both a mask alignment mark 23 comprising a convex portion and a mesa structure 24 are simultaneously formed under the Pt mask 21 and the Pt electrode 22 respectively. The etching of the GaAs substrate 18 is carried out by use of a phosphor-containing etchant.

According to the above novel method, the accuracy of alignment of the electrode on the mesa structure is surely improved. This causes an improvement in the yield of the semiconductor device. This also ensures a high reliability of the semiconductor device.

A third embodiment according to the present invention will be described with reference to FIGS. 7A to 7C, wherein a novel method for forming an electrode on a mesa structure of a substrate is provided.

Figure 7A:
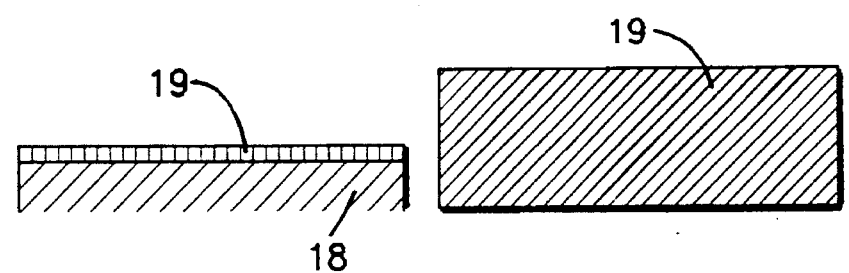
FIGS. 7A to 7C are fragmentary cross sectional elevation views illustrative of semiconductor devices in sequential fabrication steps involved in a novel method for forming the electrode on the mesa structure of the semiconductor substrate in a third embodiment according to the present invention.

With reference to FIG. 7A, a Pt electrode material 19 is deposited on an entire surface of a GaAs substrate 18.

Figure 7B:
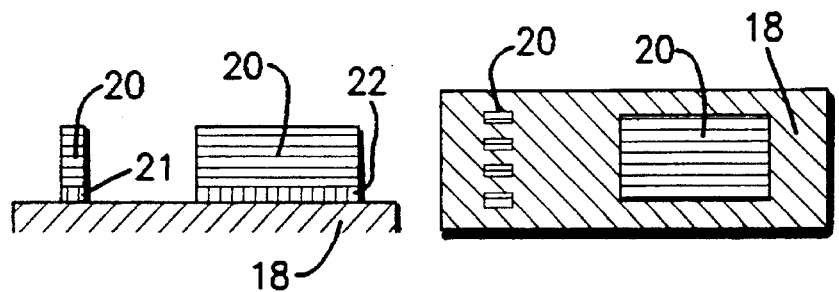

With reference to FIG. 7B, a photoresist pattern 20 is provided on the Pt electrode material 19. The photoresist pattern 20 is then used as a mask for etching the Pt electrode material 19 by a reactive ion etching method which uses a $SF_6$ gas. As a result, both a Pt mask 21, and a Pt electrode 22 are formed under the photoresist pattern 20.

Figure 7C:
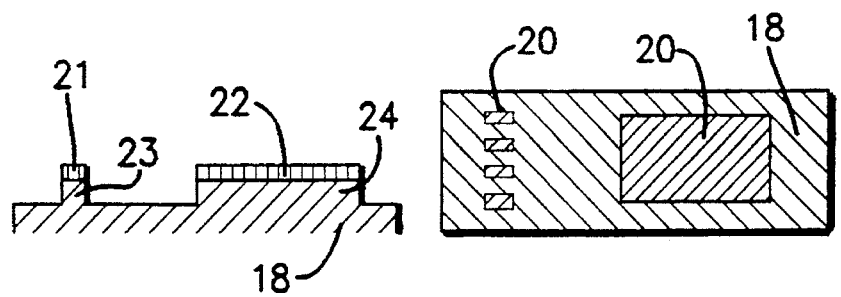

With reference to FIG. 7C, both the Pt mask 23 and the Pt electrode 24 are used as masks for etching the GaAs substrate 18. As a result, both a mask alignment mark 23 comprising a convex portion and a mesa structure 24 are simultaneously formed under the Pt mask 21 and the Pt electrode 22 respectively. The etching of the GaAs substrate 18 is carried out by use of a phosphor-containing etchant.

According to the above novel method, the accuracy of alignment of the electrode on the mesa structure is surely improved. This causes an improvement in the yield of the semiconductor device. This also ensures a high reliability of the semiconductor device.

A fourth embodiment according to the present invention will be described with reference to FIGS. 8A to 8C, wherein a novel method for forming an electrode on a mesa structure of a substrate is provided.

Figure 8A:
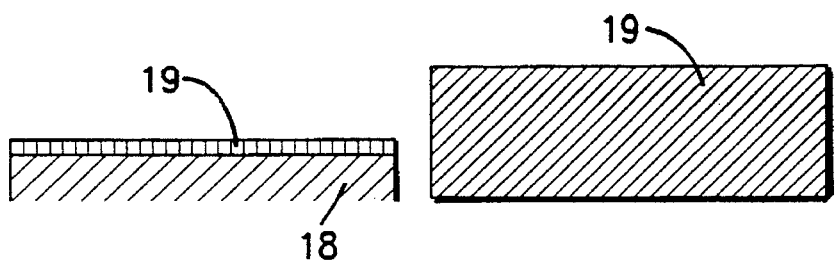
FIGS. 8A to 8C are fragmentary cross sectional elevation views illustrative of semiconductor devices in sequential fabrication steps involved in a novel method for forming the electrode on the mesa structure of the semiconductor substrate in a fourth embodiment according to the present invention.

With reference to FIG. 8A, a Pt electrode material 19 is deposited on an entire surface of a GaAs substrate 18.

Figure 8B:
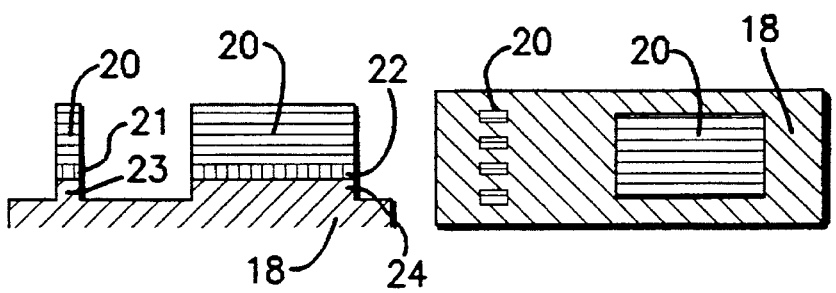

With reference to FIG. 8B, a photoresist pattern 20 is provided on the Pt electrode material 19. The photoresist pattern 20 is then used as a mask so that the Pt electrode material 19 and the GaAs substrate 18 are, in turn, etched by a reactive ion etching method which uses a $Cl_2$ gas. As a result, both a mask alignment mark 23 comprising a convex portion and a mesa structure 24 are simultaneously formed under the Pt mask 21 and the Pt electrode 22 respectively.

Figure 8C:
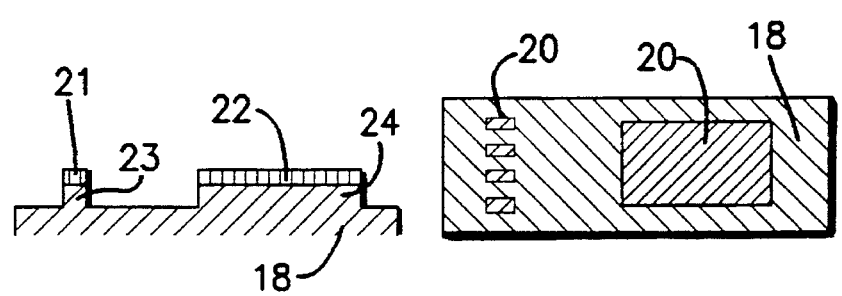

With reference to FIG. 8C, the photoresist pattern 20 is then removed.

According to the above novel method, the single mask pattern only is used. This may improve the accuracy of alignment of the electrode on the mesa structure. This causes an improvement in the yield of the semiconductor device. This also ensures a high reliability of the semiconductor device.

As modifications of the above first to fourth embodiments, any other electrically conductive materials are available for the electrode. Any multiple layered electrodes are available such as an AuGe/Ni/Au ohmic electrode and a Ti/Pt/Au electrode. Available etching methods for etching the substrate and the electrode material may be wet etching methods, dry etching methods, reactive ion etching methods, ion milling etching methods, and ion beam etching methods.

Whereas any further modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims any modifications which fall within the spirit and scope of the present invention.

What is claimed is:

1. A method for forming an electrode on a mesa structure of a semiconductor substrate, said method comprising the steps of:

selectively forming an electrode on a portion of a surface of said semiconductor substrate, said electrode being formed by the steps of: providing a photoresist pattern on said substrate; depositing an electrically conductive material on said photoresist pattern and on an exposed part of said substrate, said exposed part not being covered by said photoresist pattern; and removing said photoresist pattern being covered by said electrically conductive material to cause said electrically conductive material to remain only on said exposed part of said substrate, to form an electrode comprising a remaining part of said electrically conductive material;

providing an additional photoresist pattern on an entire surface of said substrate, said additional photoresist pattern having at least an opening over a part of said electrode;

subjecting said electrode to a selective etching using said additional photoresist pattern as a mask; and removing of said additional photoresist pattern;

subjecting said substrate to a selective etching by use of said electrode as a mask to form a mesa structure on said substrate, said mesa structure thereby being self-aligned just under said electrode.

2. A method for forming an electrode on a mesa structure of a semiconductor substrate, said method comprising the steps of:

selectively forming an electrode on a portion of a surface of said semiconductor substrate, said electrode being formed by the steps of: depositing an electrically conductive material on an entire surface of said substrate; providing a photoresist pattern on said electrically conductive material; subjecting said electrically conductive material to a selective etching using photoresist pattern as a mask to form an electrode under said photoresist pattern; removing said photoresist pattern;

providing an additional photoresist pattern on an entire surface of said substrate, said additional photoresist pattern having at least an opening over a part of said electrode;

subjecting said electrode to a selective etching using said additional photoresist pattern as a mask; and removing said additional photoresist pattern;

subjecting said substrate to a selective etching using said electrode as a mask to form a mesa structure on said substrate, said mesa structure thereby being self-aligned just under said electrode.

3. A method for forming an electrode on a mesa structure of a semiconductor substrate, said method comprising the steps of:

selectively forming both an electrode and an alignment mark mask on respective portions of a surface of said semiconductor substrate; and subjecting said substrate to a selective etching using said electrode and said alignment mark mask as masks to form a mesa structure and an alignment mark on said substrate, said mesa structure and said alignment mark thereby being simultaneously self-aligned just under said electrode and said alignment mark mask, respectively.

4. The method as claimed in claim 3, wherein said electrode and said alignment mark mask are formed by the steps of:

providing a photoresist pattern on said substrate;

depositing an electrically conductive material on said photoresist pattern and on exposed parts of said substrate, said exposed parts not being covered by said photoresist pattern; and removing said photoresist pattern covered by said electrically conductive material to cause said electrically conductive material to remain only on said exposed parts of said substrate, an electrode and an alignment mark mask thereby being formed, and comprising said remaining parts of said electrically conductive material.

5. The method as claimed in claim 4, further comprising the steps of:

providing an additional photoresist pattern on an entire surface of said substrate, said additional photoresist pattern having at least an opening over a part of said electrode;

subjecting said electrode to a selective etching using said additional photoresist pattern as a mask; and removing said additional photoresist pattern.

6. The method as claimed in claim 3, wherein said electrode is formed by the steps of:

depositing an electrically conductive material on an entire surface of said substrate;

providing a photoresist pattern on said electrically conductive material;

subjecting said electrically conductive material to a selective etching, which uses said photoresist pattern as a mask to form an electrode under said photoresist pattern; and removing said photoresist pattern.

7. The method as claimed in claim 6, further comprising the steps of:

providing an additional photoresist pattern on an entire surface of said substrate, said additional photoresist pattern having at least an opening over a part of said electrode;

subjecting said electrode to a selective etching using said additional photoresist pattern as a mask; and removing said additional photoresist pattern.

* * * * *